Figure 1:
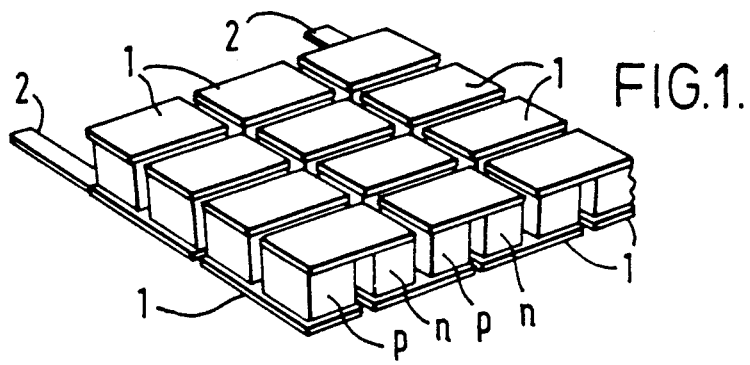

United States Patent [19]

Rowe

[11] Patent Number: 4,983,225
[45] Date of Patent: Jan. 8, 1991

[54] PROCESS OF MANUFACTURING MINIATURE THERMOELECTRIC CONVERTERS

[75] Inventor: David M. Rowe, Mid Glamorgan, United Kingdom

[73] Assignee: British Gas plc, London, England

[21] Appl. No.: 394,538

[22] Filed: Aug. 16, 1989

Related U.S. Application Data

[62] Division of Ser. No. 209,724, Jun. 22, 1988.

[30] Foreign Application Priority Data

Jun. 23, 1987 [GB] United Kingdom ............. 8714698

[51] Int. Cl.$^5$ .......................................... H01L 35/34
[52] U.S. Cl. .................................. 136/201; 136/212; 136/225; 437/21; 437/22
[58] Field of Search ................. 136/201, 212, 225; 437/21, 22

[56] References Cited

U.S. PATENT DOCUMENTS

| | | | |
|---|---|---|---|
| 4,107,723 | 8/1978 | Kamath | 357/30 |
| 4,128,733 | 12/1978 | Frass et al. | 136/262 X |
| 4,363,928 | 12/1982 | Wilson | 136/206 |
| 4,507,181 | 3/1985 | Nath et al. | 204/15 |
| 4,547,622 | 10/1985 | Fan et al. | 136/249 |
| 4,698,455 | 10/1987 | Cavicchi et al. | 136/256 |
| 4,731,338 | 3/1988 | Ralston et al. | 437/22 |
| 4,753,683 | 6/1988 | Ellion et al. | 136/244 |
| 4,897,361 | 1/1990 | Harriott et al. | 437/24 |

FOREIGN PATENT DOCUMENTS 0034538 8/1981 European Pat. Off. .
58-112377 10/1985 Japan .

OTHER PUBLICATIONS

Van Herwaarden et al.; *IEEE Trans. on Inst. & Measurement*, vol. LM-35, No. 2, Jun. 86, pp. 224–225.
Abowitz et al., *Semiconductor Products & Solid State Tech.*, vol. 8, No. 2, Feb., 1965, pp. 18–22.

*Primary Examiner*—Peter A. Nelson
*Attorney, Agent, or Firm*—Larson and Taylor

[57] ABSTRACT

A thermoelectric semiconductor multicouple array comprises a substrate of semi-insulating material 10, alternate n-type and p-type strips or legs ion implanted into said substrate and connected together electrically in series, and terminal means 11 connected to said series-connected strips or legs. The array may be incorporated in an integrated circuit chip. A method of making such thermoelectric semiconductor multicouple arrays is also disclosed.

4 Claims, 2 Drawing Sheets

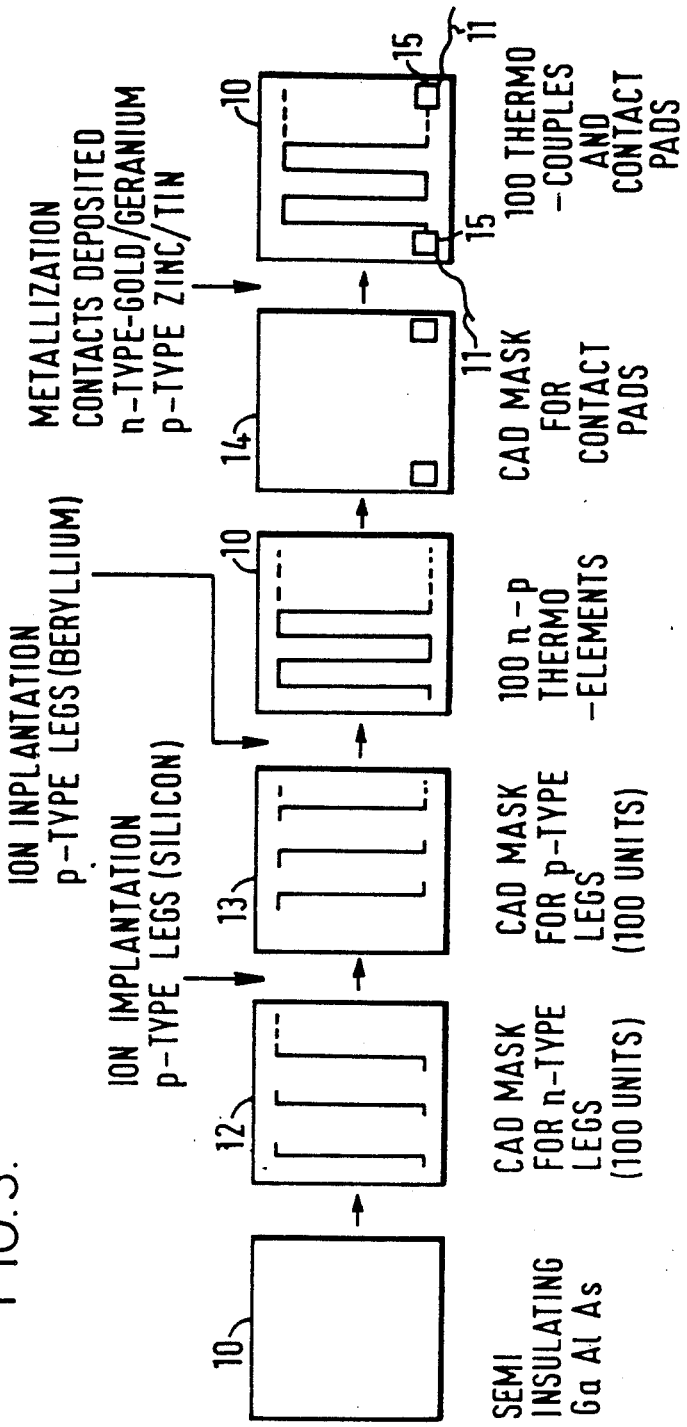

PROCESS OF MANUFACTURING MINIATURE THERMOELECTRIC CONVERTERS

This is a division of application Ser. No. 7/209,724 filed June 22, 1988.

The present invention relates to miniature thermoelectric converters in the form of thermoelectric semiconductor multicouple arrays which can be employed both for generating electricity when a temperature difference is applied across the thermocouples (generating mode) and for maintaining a temperature stability when a current is passed through time (refrigerating mode).

As at present constructed a thermoelectric semi-conductor multicouple array consists of a large number of alternate n-type and p-type semiconductor elements which are joined so as to form junctions. The multicouples are then arranged electrically in series and thermally in parallel so as to form a module.

In conventional semiconductor thermocouples electrical power is generated at relatively high values of current and low voltages with the series connection of thermocouples providing the required voltage build-up to operate electronic/electromechanical devices. The power output from a thermocouple is approximately proportional to the cross-sectional area of the thermoelement and inversely proportional to the element length. Consequently in low power generation, elements of small cross-sectional area and with a large ratio of length to cross sectional area are required. However, the brittle nature of thermoelectric semiconductor material prevents it from being machined into sections of less than about 30 thousandths of an inch (0.075 millimetres), which limits their length to cross sectional area ratio.

It is an object of the present invention to provide an improved miniature thermoelectric semiconductor multicouple array and a method for the manufacturing of such an array. The array may consist of several thousand elements with each possessing an extreme length to cross-sectional are ratio. This enable low levels of power to be produced at relatively high voltages.

From one object the invention provide a thermoelectric semiconductor multicouple array comprising a substrate of semi-insulating material alternate n-type and p-type strips or legs ion implanted into said substrate and connected together electrically in series and terminal means connected to said series-connected strips or legs.

The invention further provides an integrated circuit chip incorporating such a thermoelectric semiconductor multicouple array.

From another aspect the invention provides a method of making a thermoelectric semiconductor multicouple array which comprises the steps of forming a surface of a semi-insulating material, ion implanting a first plurality of strips of one conductivity type through a mask onto said surface, ion implanting a second plurality of strips of the opposite conductivity type through a mask onto said surface so that said second strips are disposed alternately between said first strips and the assembly of n-type and p-type strips are electrically connected in series and applying contact members at the ends of said interconnected strips.

The surface of semi-insulating material is preferably a surface of a sheet or wafer of that material and a plurality of such sheets each bearing an array of semiconductor thermocouples may be stacked side-by-side to form a module.

A suitable semi-insulating material would be, for example, an undoped semi-insulating semiconductor which when doped n- or p-type by ion implantation exhibits good thermoelectric properties, such as gallium-aluminum-arsenide or silicon germanium alloy strips deposited onto an insulating oxide layer.

Figure 2A:
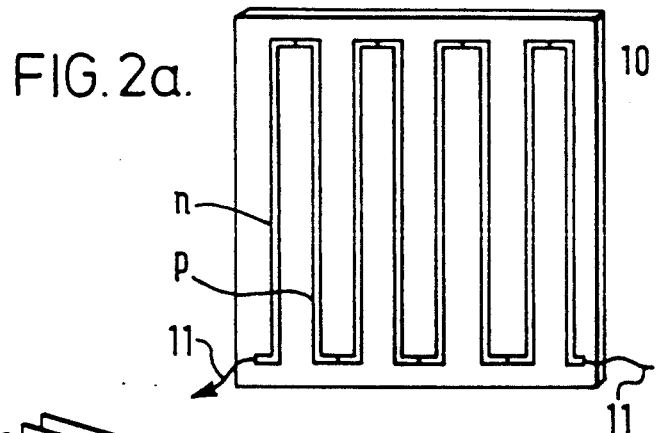
Figure 2B:
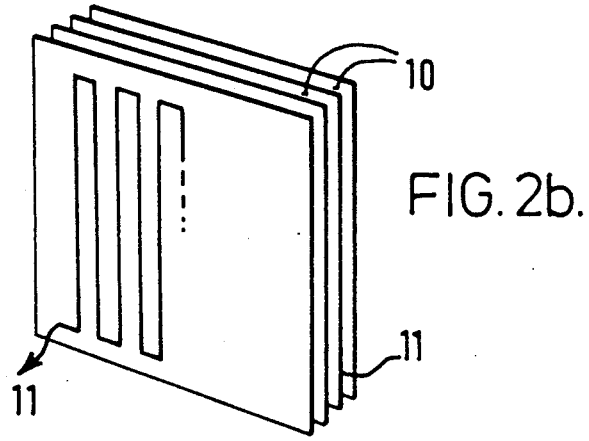

The invention will now be further described, by way of example, with reference to the accompanying drawings which:

FIG. 1 illustrates diagrammatically a prior art form of thermoelectric semiconductor multicouple array, FIG. 2a illustrates diagrammatically one embodiment of device according to the invention, FIG. 2b illustrates a stack of device as shown in FIG. 2a; and FIG. 3 is a flow diagram illustrating a preferred method of forming thermoelectric semiconductor multicouple arrays according to the invention.

Referring to FIG. 1 there is shown a known construction of a thermoelectric semiconductor multicouple array comprising a large number of alternate n-type and p-type semiconductor elements or legs joined alternately by conductors 1 so as to form junctions electrically connected is series. The structure forms a module from which an output voltage can be derived via the terminals 2 when a temperature difference is applied across the module. However such a construction has a relatively poor ratio of length to cross-sectional area for the thermocouple legs typically of the order of one to ten per centimetre.

The construction according to the present invention overcomes this difficulty by enabling the thermocouple legs to have a very high ratio of length to cross-sectional area of the order of a thousand per centimetre whereby low power levels at relatively large output voltages can be obtained.

One preferred embodiment of the invention is shown in FIG. 2 which comprises a substrate sheet 10 of gallium aluminium arsenide in which are ion implanted alternate n-type and p-type strips which are electrically connected in series. Electrical connections 11 are made to the ends of the series-connected strips. In practice several thousand such thermocouple elements having an extreme length to cross-section ratio can be accommodated on a substrate one centimetre square. Back etching of the substrate may be employed to minimise thermal shunting of the active elements.

As shown in FIG. 2b a plurality of such sheets 10 can be stacked side-by-side to form a module.

FIG. 3 is a flow diagram illustrating a preferred method of forming thermoelectric semiconductor multicouple arrays according to the invention. A 2 millimeter square substrate sheet 10 of gallium aluminium arsenide or other suitable semi-insulating material has the thermocouple n-type and p-type legs ion implanted thereon through suitable masks which may be produced by computer aided designed. Up to 100 thermocouples may be fabricated on a 2 millimeter square gallium aluminium arsenide chip. Three sets of masks are employed, one 12 for use during silicon ion implantation of the n-type legs of the thermocouples, another 13 for use during beryllium ion implantation of the p-type legs of the thermocouples and a further mask 14 for use during the metallisation process of forming the contact pads 15. These may be a deposit of gold/germanium for n-type and of zinc/tin for p-type. The thermocouple legs may have a cross-section of about 2μm by 5μm. As is well-known to persons skilled in the art, the electrical connections between the n-type and p-type strips may also be formed by the metallisation process.

The method of fabrication according to the invention allows thermocouples to be made with an extreme ratio of length to cross-sectional area enabling relatively large voltages to be generated at relatively low power. Moreover this method of fabrication enables very large numbers of miniature thermocouples to be incorporated in an integrated circuit chip thereby providing a built-in source of electric power or a temperature stabilising capability.

I claim:

1. A method of making a thermoelectric semiconductor multicouple array which comprises the steps of forming a surface of a semi-insulating material, ion implanting a first plurality of of strips of one conductivity type through a mask onto said surface, ion implanting a second plurality of strips of the opposite conductivity type through a mask onto said surface so that said second strips are disposed alternately between said first strips and the assembly of n-type and p-type strips are electrically connected in series.

2. A method as claimed in claim 1, including the further step of applying contact members at the ends of said interconnected strips.

3. A method as claimed in claim 1, in which the surface of semi-insulating material is in the form of a sheet or wafer and a plurality of such sheets or wafers each bearing a said array are stacked side-by-side and interconnected together.

4. A method as claimed in claim 1, in which the surface of semi-insulating material is part of an integrated circuit chip.

* * * * *